United States Patent [19]
Hosono

[11] Patent Number: 5,382,484
[45] Date of Patent: Jan. 17, 1995

[54] METHOD OF CORRECTING DEFECTS IN THE PATTERN OF PHASE SHIFT MASK

[75] Inventor: Kunihiro Hosono, Hyogo, Japan

[73] Assignee: Mitsubishi Denki Kabushiki Kaisha, Tokyo, Japan

[21] Appl. No.: 54,616

[22] Filed: Apr. 29, 1993

[30] Foreign Application Priority Data

Aug. 21, 1992 [JP] Japan .................. 4-222543
Apr. 8, 1993 [JP] Japan .................. 5-081966

[51] Int. Cl.$^6$ .................................. G03F 9/00
[52] U.S. Cl. ............................ 430/5; 430/321; 430/323; 156/646
[58] Field of Search ............. 430/5, 323, 321; 156/646

[56] References Cited

U.S. PATENT DOCUMENTS

| | | | |
|---|---|---|---|
| 4,457,803 | 7/1984 | Takigawa | 156/626 |
| 4,548,883 | 10/1985 | Wagner | 430/5 |
| 4,698,236 | 10/1987 | Kellogg et al. | 427/43.1 |
| 4,849,642 | 7/1989 | Katsumi | 430/5 |

FOREIGN PATENT DOCUMENTS

| | | |
|---|---|---|
| 61-084833 | 4/1986 | Japan . |
| 62-60699 | 12/1987 | Japan . |
| 1-32494 | 7/1989 | Japan . |
| 3132662 | 10/1989 | Japan . |
| 2-46459 | 2/1990 | Japan . |
| 3-139647 | 6/1991 | Japan . |
| 4-50844 | 2/1992 | Japan . |
| 4-128758 | 4/1992 | Japan . |
| 4-131853 | 5/1992 | Japan . |

*Primary Examiner*—Steve Rosasco
*Attorney, Agent, or Firm*—Lowe, Price, LeBlanc & Becker

[57] ABSTRACT

A method of correcting a pattern defect in a phase shift mask allowing planarization of bump and divot defects in a phase shift mask with high accuracy is disclosed. In the case of a bump defect, the region including the bump defect is irradiated with an FIB and supplied with a deposition gas, thereby forming a planarization film, and then the planarization film is etched back with the FIB. Thereafter, a layer containing ions is removed away using a laser beam. In the case of a divot defect, the region including the divot defect is planarized by application of an SOG film, and then the unnecessary part of the SOG film other than in the region of the divot defect is removed away by etching back to the interface of the SOG film with the FIB and developing the same. Thereafter, the layer containing ions is removed away utilizing a laser beam.

20 Claims, 20 Drawing Sheets

GAS-ON

GAS-OFF

GAS-ON

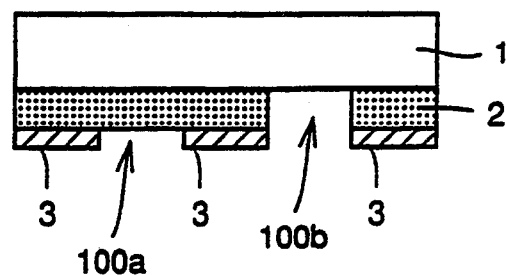
FIG.47(a) PRIOR ART
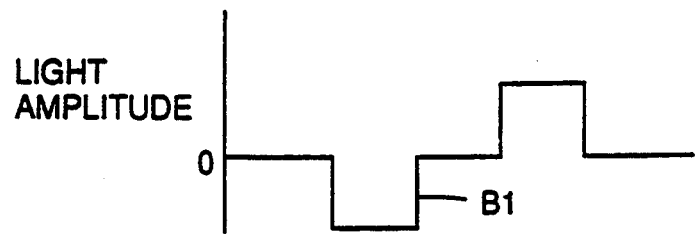
FIG.47(b) PRIOR ART  LIGHT AMPLITUDE
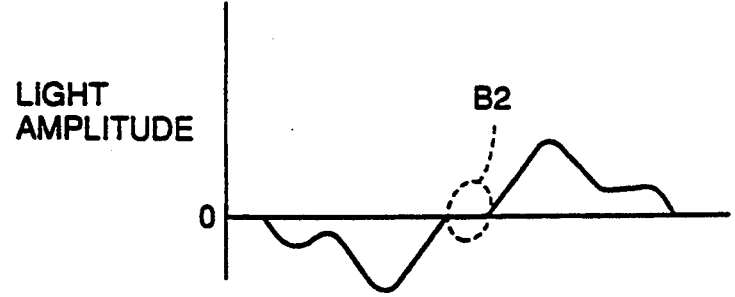
FIG.47(c) PRIOR ART  LIGHT AMPLITUDE
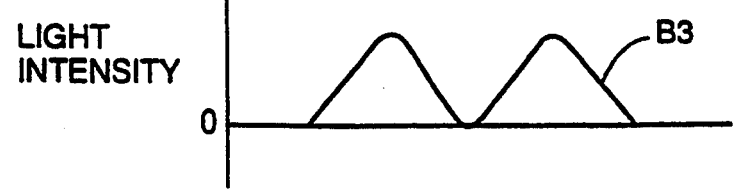
FIG.47(d) PRIOR ART  LIGHT INTENSITY

METHOD OF CORRECTING DEFECTS IN THE PATTERN OF PHASE SHIFT MASK

BACKGROUND OF THE INVENTION

1. Field of the Invention

The present invention relates generally to methods of correcting defects in phase shift mask patterns, and more specifically, to a method of correcting defects in a phase shift mask patten having bump defects (excess shifters) and divot defects (missing shifters).

2. Description of the Background Art

Conventionally, as a general method of correcting defects in a mask pattern, there is known a method utilizing a laser beam or a focused ion beam (FIB). FIGS. 36–38 are cross sectional views for use in illustration of a conventional general method of correcting black bump defects in a metal light shielding film of a mask. Referring to FIGS. 36–38, the conventional method of correcting black bump defects in the metal light shielding film will be described.

As illustrated in FIG. 36, a usual mask has a metal light shielding film 43 of a prescribed pattern formed on a mask substrate 41. A black bump defect (excess metal film) 42 is generated when the metal light shielding film 43 is formed. FIGS. 39–41 are views showing a manufacturing process for use in illustration of one example of causes for generation of the black bump defect 42. In order to form the metal light shielding film 43 having a prescribed pattern (see FIG. 36), a metal light shielding film layer 43a is formed on the entire surface of the mask substrate 41 as shown in FIG. 39. After resist 44 is formed on the metal light shielding film layer 43a, a prescribed portion of the resist 44 is exposed. At the time of exposure, if an alien substance 45 is present on the resist 44 at the position to be exposed (see FIG. 39), the portion of resist 44 positioned under the alien substance 45 is not exposed. If the region to be originally exposed is thus not exposed, unnecessary resist 44a as shown in FIG. 40 is formed when the resist 44 is developed. When such necessary resist 44a is formed, and the metal light shielding film layer 43a is subjected to a dry etching utilizing as mask the resist 44 and 44a, the metal light shielding film black bump defect 42 as shown in FIG. 41 is formed. Thus, conventionally, when the metal light shielding film 43 is formed, the metal light shielding film black bump defect 42 is generated.

A metal such as Cr or a metal compound such as MoSi is used as a material for the metal light shielding film 43. In order to correct the black bump defect 42 in the metal light shielding film, as shown in FIG. 37, an Nd:YAG laser beam 9 is irradiated upon the black bump defect 42 in the metal light shielding film. Thus, the black bump defect 42 is evaporated as shown in FIG. 38 and removed away. The Nd:YAG laser beam used has a wavelength of 532 nm and irradiated for about 200 mJ–300 mJ.

FIGS. 42–44 are cross sectional views of structures for use in illustration of a general method of correcting a white divot defect (missing shifter) in a metal light shielding film of a mask according to a conventional technique. Referring to FIGS. 42–44, this conventional method of correcting a white defect in the metal light shielding film will be described.

As illustrated in FIG. 42, a metal light shielding film 53 of a prescribed pattern is formed on a mask substrate 51. A white divot defect 52 is generated when the metal light shielding film 53 is formed. FIG. 45 is a cross sectional view for use in illustration of one example of causes for generation of such a conventional metal light shielding film white divot defect 52. Referring to FIG. 45, in order to form the metal light shielding film 53 (see FIG. 42), a metal light shielding film layer 53a is formed on the entire surface of the mask substrate 51 by means of sputtering or the like. When the metal light shielding film layer 53a is formed, the pinhole (white defect) 52 is generated. If the region in which the pinhole 52 is located is a region to be formed as the metal light shielding film 53 (see FIG. 42), the metal light shielding film white divot defect 52 is generated in the metal light shielding film 53 eventually formed. Thus, in a conventional process of forming the metal light shielding film layer 53a, the metal light shielding film white divot defect 52 is generated.

In order to correct the white divot defect 52 in the metal light shielding film, a deposition gas 6 formed of a hydrocarbon-based gas is introduced into the region of the defect as shown in FIG. 43. An FIB 5 is irradiated upon the defect region while scanning the region. A carbon film 52 is thus formed to fill the white divot defect 52 in the metal light shielding film as shown in FIG. 44. Ga ions of about 20–30 keV are utilized as the FIB 5. A metal carbonyl-based gas or an organic metal-based gas may be used other than the hydrocarbon gas as the deposition gas 6.

The above-stated method has been known as a method of correcting defects such as the black bump defect 42 and the white divot defect 52 produced in a conventional general mask. When the above-stated method of correction is utilized for defects in a phase shift mask without modification, however, the following problem is encountered.

Now, a phase shifter process utilizing a phase shift mask will be described. According to the phase shifter process, a phase difference is provided to light passing through a photomask, in order to further improve the resolution of a lithography technique. Thus, the light intensity profile can be improved. FIGS. 46 and 47 are schematic views for use in illustration of the principles of the phase shifter process. Referring to FIG. 46(a), according to a conventional usual photomask, a metal light shielding film 43 of chromium constituting a light shielding portion is formed on a transparent mask substrate 41 such as a silica substrate. More specifically, the region in which the metal light shielding film 43 is formed constitutes the light shielding portion, while the region without the metal light shielding film 43 constitutes light transmitting portions 100a and 100b. In this manner, conventionally the metal light shielding films 43 are formed a prescribed distant apart from each other, and a repetitive pattern of lines and spaces is formed. The amplitude of light transmitted through thus formed mask pattern ideally takes a waveform as shown in FIG. 46(b) at A1. More specifically, ideally, light transmitted through the metal light shielding film 43 is 0 and the entire light passes through the light transmitting portions 100a and 100b. In such an ideal state, the amplitude of transmitting light takes the waveform A1 as shown in FIG. 46(b). However, the amplitude of actual transmitting light takes a waveform A2a or A2b as shown in FIG. 46(c) due to the diffraction of the light. The waveform A2a is the amplitude waveform of the light transmitted through one light transmitting portion 100a, while the waveform A2b is the amplitude waveform of light transmitted through the other light transmitting portion 100b. When these two amplitude waveforms A2a and A2b are combined, a light intensity distribution as shown in FIG. 46(d) at A3 results, which takes a waveform whose central portion is raised. More specifically, the light intensity distribution loses its sharpness, thus resulting in a blurry image due to the diffraction of the light. This makes it difficult to achieve sharp exposure.

In contrast, when the phase shifter 2 is provided under the one light transmitting portion 100a as illustrated in FIG. 47(a), the blurriness of the image due to the diffraction of light is canceled by inversion of the phase. Thus, a sharp image is transferred and resolution is improved. More specifically, if the phase shifter 2 which provide the one light transmitting portion 100a with a phase shift of 180°, for example, light passed through the phase shifter 2 is inverted as shown at B1 (see FIG. 47(b)). Meanwhile, light transmitted through the light transmitting portion 100b does not pass through the phase shifter 2 and therefore the above-described inversion does not take place. Thus, the lights emitted upon a material to be exposed cancel one another at the position shown in FIG. 47(c) at B2. As a result, the light intensity distribution given to the material to be exposed takes an ideal sharp shape as shown in FIG. 47(d) at B3. Thus, the method of forming phase shifters 100a for every other pattern of lines and spaces is generally called Levinson type phase shifter process.

When a defect of a phase shift mask used in the phase shifter process as described above is corrected, if a conventional general method of correcting mask defects is utilized, the following problems are encountered.

FIGS. 48 and 49 are cross sectional views for use in illustration of a conventional method of correcting a bump defect in a phase shift mask. Referring to FIGS. 48 and 49, in the phase shift mask, a phase shifter 2 having a prescribed pattern is formed on a mask substrate 1 formed of silica. A metal light shielding film 3 is formed in a prescribed region on the phase shifter 2. A shifter bump defect 4 is produced when such a phase shift mask is formed.

When such a shifter bump defect 4 is formed in a part of the light transmitting portion originally exclusive of the phase shifter 2, the phase of light corresponding to the portion of the light transmitting portion in which the shifter bump defect 4 is formed will be inverted by 180°. If the inversion of the phase of light takes place in only part of the light transmitting portion, the part of a material to be exposed (resist) corresponding to the light transmitting portion is partially not exposed. If a development is performed in this state, resist will be formed in the region which should originally be without the resist. If a patterning is performed utilizing such resist, a pattern as designed will not be obtained.

Use of an Nd:YAG laser beam 9 for correcting the shifter bump defect 4 can not remove away the shifter bump defect 4, because the Nd:YAG laser beam 9 is transmitted through the shifter defect 4 formed of SOG or SiO₂.

FIGS. 50-52 are cross sectional views of structures for use in illustration of another conventional method of correcting a bump defect in a phase shift mask. According to this method, as can be seen from change in the state from FIG. 50 to FIG. 51, an FIB 5 utilizing Ga ions is irradiated upon the region of the shifter bump defect 4 while scanning the region. Thus, the shifter bump defect 4 is etched away by the FIB 5. Such a technique of etching utilizing an FIB 5 is disclosed in, for example, U.S. Pat. No. 4,548,883. However, since the thickness of the shifter bump defect 4 (about 4000 Å) is about four times as large as the thickness of the black defect 42 (about 1000 Å) in the metal light shielding film illustrated in FIG. 36, the form of the shifter bump defect 4 is rather three-dimensional as compared to the black bump defect 42 in the metal light shielding film. Since the phase shifter 2 should invert the phase of lights by 180°, it requires a certain degree of thickness (about 4000 Å). Therefore, the thickness of the shifter bump defect 4 formed at the time of forming the phase shifter 2 naturally becomes as thick as about 4000 Å, and the shifter bump defect 4 takes a three dimensional form. It is difficult to evenly scan the shifter bump defect 4 having such a three-dimensional form with an FIB 5. This makes it difficult to etch the shifter bump defect 4 evenly, and the surface of the mask substrate 1 positioned at both lower end portions of the shifter bump defect 4 is etched. Thus, a divot defect 71 as shown in FIG. 52 is produced this time in a surface of the mask substrate 1, and a Ga stain (Ga residue) 72 by Ga ions sticks to the surface of the divot defect 71. The Ga stain 72 which absorbs about 50% of i rays is transferred as a defect at the time of transfer.

As described above, there are various problems associated with conventional methods of correcting bump defects in a phase shift mask.

FIGS. 53 and 54 are cross sectional views of structures for use in illustration of a conventional method of correcting a shifter divot defect in a phase shift mask. As shown in FIG. 53, in this phase shift mask, a phase shifter 12 is formed in a prescribed region on a mask substrate 11. A metal light shielding film 13 is formed in a prescribed region on a phase shifter 12. The shifter divot defect 10 of the phase shifter 12 would be corrected by the following method. More specifically stated, as shown in FIG. 54, as is the case with the conventional method of correcting a white defect in a metal light shielding film described in conjunction with FIGS. 42 to 44, an FIB 5 of Ga ions is irradiated upon the defect region with supply of a hydrocarbon-based gas (deposition gas) 6, while scanning the region. A carbon film 81 is thus formed to fill the shifter divot defect 10. Such technique is disclosed, for example, in U.S. Pat. No. 4,698,236. The carbon film 81 however does not have light transmittance and is transferred as a defect at the time of transfer.

FIGS. 55 and 56 are cross sectional views for use in illustration of another conventional method of correcting a shifter divot defect in a phase shift mask. According to this method, as can be seen from change in the state from FIG. 55 to FIG. 56, an Ar laser beam 19 is irradiated upon the region of a defect while supplying a gas 92 of Mo (Co)₆, W (Co)₆ or Cr (Co)₆ to the defect region. Thus, a metal film 91 of Mo, W or Cr is formed to fill the shifter divot defect 10. However, since the metal film 91 does not have light transmittance either, the same problem as with the method of correction shown in FIGS. 53 and 54 is encountered. More specifically, not having light transmittance, the metal film 91 can be transferred as a defect at the time of transfer.

More specifically, according to the conventional method of correcting a shifter bump defect 4 in a phase shift mask utilizing a laser beam, it has been difficult to remove away the shifter bump defect 4 itself. Further, according to the method of correcting a shifter bump defect utilizing an FIB, the shifter bump defect can be removed, but the surface of the mask substrate 1 is etched as well, generating a divot defect 71 this time, and a Ga stain 72 of Ga ions is formed on the surface of the divot defect 71. According to the method of correcting the shifter divot defect 10 utilizing the FIB 5 and the deposition gas 6, the carbon film 81 formed as a result does not have light transmittance and is transferred as a defect, and the surface of the carbon film 81 reflects the form of the shifter divot defect 10. According to the method of correcting the shifter divot defect 10 utilizing the Ar laser beam 19 and the deposition gas 92, the resultant metal film 91 does not have light transmittance as is the case with the carbon film 81 and is transferred as a defect.

SUMMARY OF THE INVENTION

It is one object of the invention to planarize a bump defect in a phase shifter more accurately and readily in a method of correcting a pattern defect in a phase shift mask.

Another object of the invention is to fill a divot defect in a phase shifter with a film having light transmittance and correct the defect to planarize the surface.

A method of correcting a pattern defect in a phase shift mask according to one aspect of the invention includes forming a correction film surrounding and covering a bump defect, and removing away the bump defect together with the correction film by etching back the correction film.

A method of correcting a pattern defect in a phase shift mask according to another aspect of the invention includes forming a planarization film covering a bump defect by irradiating a region including the bump defect with an ion beam and supplying the region with a deposition gas, etching back the planarization film by irradiating a surface of the planarization film with an ion beam, and removing away an ion containing layer by irradiating the ion containing layer remaining in the etched back region with a laser beam.

Since the correction film is formed to cover the bump defect and then the bump defect is removed away together with the correction film by etching back the correction film, the bump defect can readily be removed away.

According to one aspect of the invention, a method of correcting a pattern defect in a phase shift mask includes forming a planarization film to cover a bump defect by irradiating an ion beam upon the region including the bump defect while supplying a deposition gas, etching back the planarization film by irradiating an ion beam upon the surface of the planarization film, and irradiating a laser beam upon a layer containing excess ions remaining in the etched back region and removing the layer including ions.

Since an ion beam is irradiated upon a region including a bump defect while a deposition gas is supplied, a competing reaction of deposition and etching is caused, thereby promoting planarization at the time of deposition, so that the planarization film covering the bump defect is readily formed and the bump defect is removed away together with the planarization film as the planarization film is etched back.

Furthermore, if the step of forming the planarization film includes a first step of irradiating an ion beam upon the region including the bump defect while supplying a deposition gas to the region and a second step of only irradiating the ion beam to the region including the bump defect, with the first step and the second step being alternately conducted at prescribed time intervals, planarization of a convexo-concave pattern is further promoted thereby producing a further planarized film, because the speed of direct etching by ion irradiation is higher in the edges of the pattern i.e. convex portion.

A method of correcting a pattern defect in a phase shift mask according to another aspect of the invention includes forming on a phase shifter having a divot defect, a correction film having a reflection index about the same as the phase shifter and having solution selectivity to the phase shifter and leaving part of the correction film in the divot defect and removing the other part correction film by etching back the correction film.

Since the correction film having a reflection index about the same as and solution selectivity to the phase shifter is formed on the phase shifter having the divot defect, the divot defects filled and planarized. When the correction film is etched back, a part of the correction film is left in the divot defect and the other part of the correction film is removed away, the divot defect can readily be corrected.

A method of correcting a pattern defect in a phase shift mask, in another aspect of the invention, includes covering a first phase shifter layer having a divot defect by forming a second phase shifter layer having solution selectivity to the first phase shifter layer and a region subjected to an ion beam irradiation, etching back a prescribed region of the second phase shifter layer by irradiating an ion beam upon a surface of the second shifter layer, removing the second phase shifter layer other than the region subjected to the ion beam irradiation by developing the second phase shifter layer, and removing a layer containing ions by irradiating a laser beam upon the layer containing ions remaining in the region subjected to the ion beam irradiation.

Since the second phase shifter layer having solution selectivity to the first phase shifter layer and the region subjected to the ion beam is formed to cover the first phase shifter layer having a divot defect, the divot defect is filled and planarized by the second phase shifter layer. Furthermore, irradiation of the ion beam upon the surface of the second phase shifter layer etches back a prescribed portion of the second phase shifter layer, then, the second phase shifter layer other than the region subjected to the ion beam irradiation is removed away by developing the second phase shifter layer, and then the layer containing ions is removed away by irradiation of a laser beam upon the layer containing ions remaining in the region subjected to the ion beam, with unnecessary part of the second phase shifter layer and the layer containing ions being removed away.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 47(a)-(d) are a second schematic view for use in illustration of the principles of the conventional phase shift process;

DESCRIPTION OF THE PREFERRED EMBODIMENTS

Now, the preferred embodiments of the invention will be described in conjunction with the drawings.

Referring to FIGS. 1-8, a method of correcting a pattern defect in accordance with a first embodiment will be described.

Figure 1:
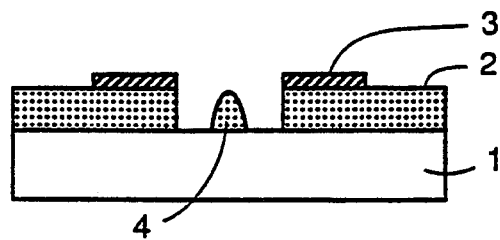
FIGS. 1 through 8 are cross sectional views for use in illustration of steps (1st-8th) in a method of correcting a shifter bump defect in a phase shift mask in accordance with a first embodiment of the invention.
Figure 2:
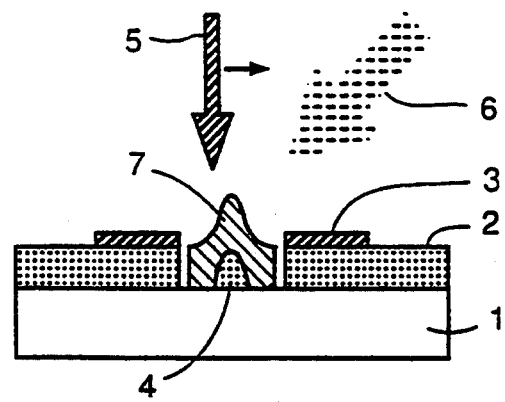
Figure 3:
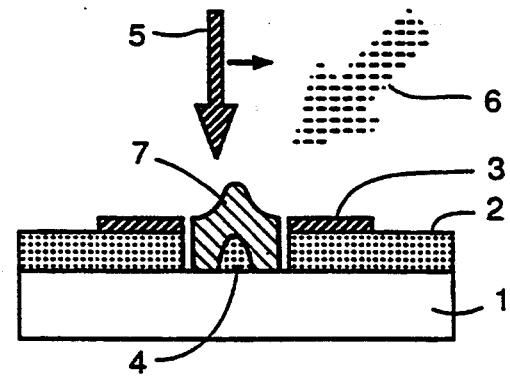
Figure 4:
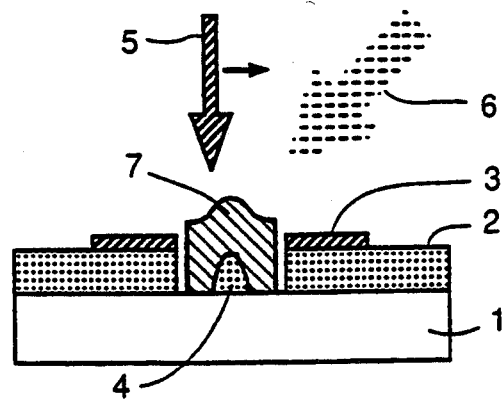
Figure 5:
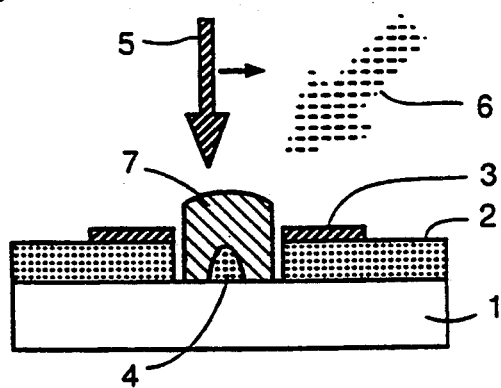

As illustrated in FIG. 1, a phase shifter 2 of $SiO_2$ is formed in a prescribed region on a mask substrate 1 formed of silica. A metal light shielding film 3 of a metal such as Cr or metal compound such as MoSi is formed in a prescribed region on the phase shifter 2. Now, the case in which a shifter bump defect 4 is produced at the time of forming the phase shifter 2 is considered. The phase shifter 2 is formed by a heat treatment at a temperature around in the range from 200 to 300° C. after application of an SOG film thereto. When the shifter bump defect 4 is produced at the time of forming such phase shifter 2, a planarization film 7 is formed by an FIB assist deposition so as to cover the shifter bump defect 4 as illustrated in FIGS. 2-5. More specifically, the region including the shifter bump defect 4 is scanned with an FIB 5 with a deposition gas 6 formed of a hydrocarbon based gas being supplied thereto. Thus, a competiting reaction of the deposition and etching by ions is caused, and, therefore planarization at the time of deposition is promoted and the planarization film 7 of carbon is formed. More specifically, in the process of forming the planarization film 7, deposition proceeds as etching of a surface of the planarization film 7 proceeds. The etching proceeds faster in the raised portion of the surface of the planarization film 7 than in the other portions. As a result, planarization of the surface of the planarization film 7 is accelerated while deposition of the planarization film 7 is performed. The planarization film 7 of carbon has an etching rate of about the same degree as the shifter defect 4. A Ga ion beam of 20-30 keV is used as the FIB 5.

Figure 6:
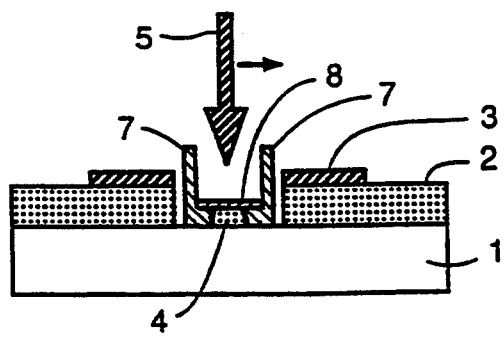

As illustrated in FIG. 6, the planarization film 7 together with the shifter bump defect 4 is etched back utilizing the FIB 5. In this step of etching back, the planarization film 7 is etched back leaving the opposite end portions of the planarization film 7. Thus, reflection ions from the FIB 5 for scanning can effectively be prevented from being irradiated upon the mask substrate 1. Consequently, the mask substrate 1 can be prevented from being etched at the time of etching back with the FIB 5. Besides Ga ions, Au, Si, Be, In or Zn ions may be employed as the FIB 5 for use in the step. When the planarization film 7 is etched back by the FIB 5, a layer containing ions 8 is created by irradiation of ions upon the surface layer of the planarization film 7. If, for example, Ga ions of 30 keV is employed as the FIB 5, the layer containing ions 8 produced will have a thickness of about 30 nm. In order to prevent etching of the mask substrate 1 by particles bounced back, the region to be etched back is preferably set further inside than the region of the planarization film 7. In the process of etching back, signal change in the interface between the planarization film 7 and the mask substrate 1 is detected by detecting a secondary signal such as secondary ions, secondary electrons, an x ray, etc. An apparatus for detecting secondary ions is disclosed, for example, in U.S. Pat. No. 4,457,803. The etching back is stopped based on a detection of such signal change.

Figure 7:
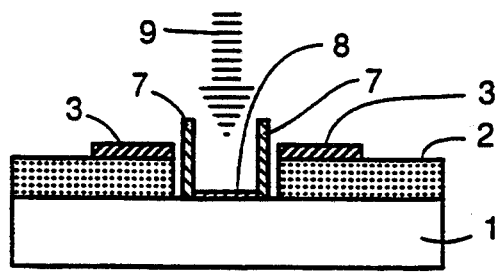
Figure 8:
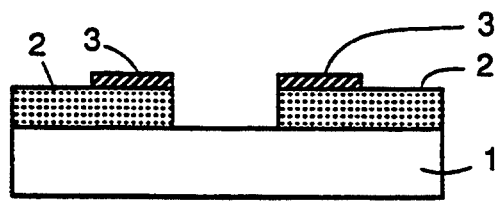
Figure 9:
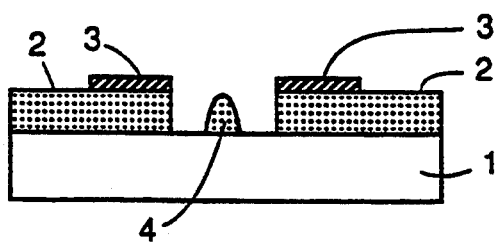
FIGS. 9 through 16 are cross sectional views for use in illustration of steps (1st-8th) in a method of correcting a shifter bump defect in a phase shift mask in accordance with a second embodiment of the invention.

As illustrated in FIG. 7, the concave planarization film 7 and the layer containing ions 8 are removed away by irradiation of an Nd:YAG laser 9 having a wavelength of 532 nm upon the concave planarization film 7 and the layer containing ions 8. Thus, as illustrated in FIG. 8, the shifter bump defect 4 is planarized, thereby correcting the defect.

Figure 10:
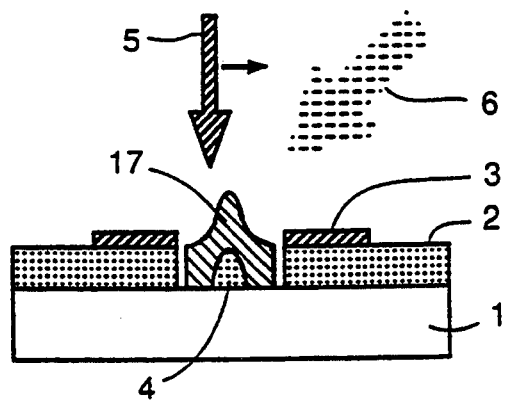
Figure 11:
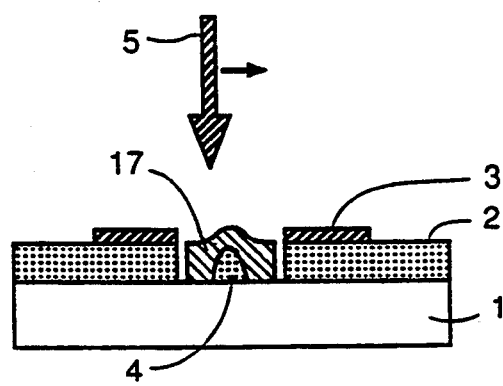
Figure 12:
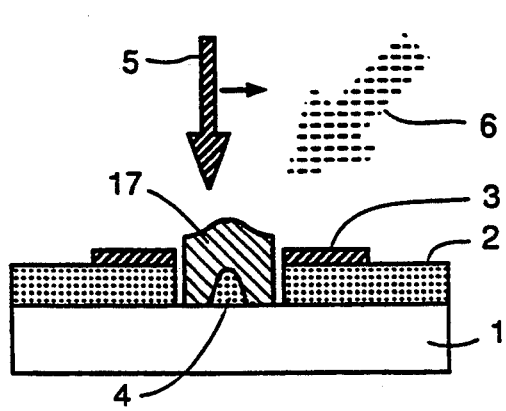
Figure 13:
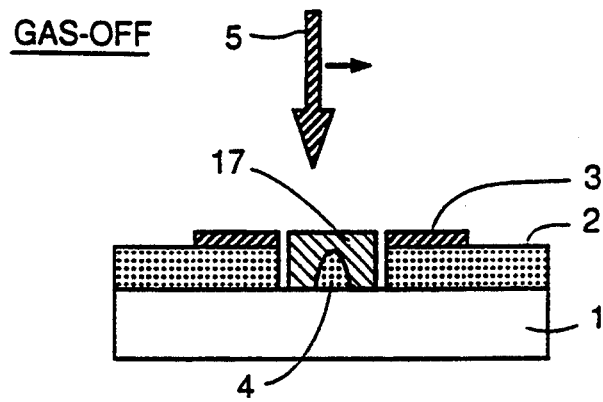
Figure 14:
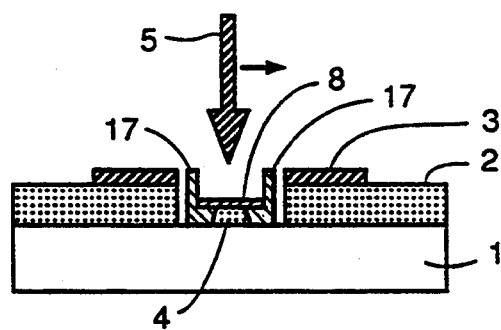
Figure 15:
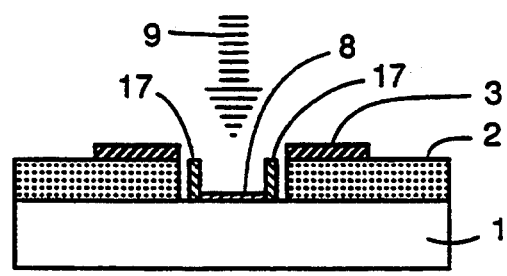
Figure 16:
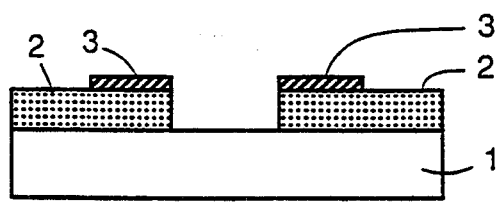
Figure 17:
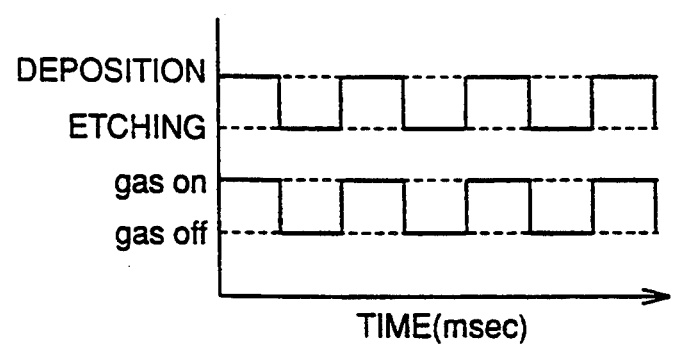
FIG. 17 is a representation for use in illustration of a manufacturing method in a step of forming a planarization film in accordance with the second embodiment shown in FIGS. 10-13.

Now, referring to FIGS. 9–17, a method of correcting a pattern defect in a phase shift mask in accordance with a second embodiment is different from the first embodiment in a method of forming a planarization film 17 covering a shifter bump defect 4. More specifically, in this second embodiment, as illustrated in FIGS. 10–13 and 17, supply of a deposition gas 6 is conducted at prescribed intervals. In other words, while the deposition gas 6 is being supplied (on state), the deposition mainly proceeds, and while the deposition gas is not being supplied (off state), the etching proceeds. Thus, when the planarization film 17 is formed the supply of the deposition gas is turned on and off at prescribed intervals, permitting intentional etching, and planarization of the planarization film 17 is further promoted. More specifically, as illustrated in FIG. 10, when the deposition gas is in an on state, as is the case with the first embodiment shown in FIGS. 2 to 5, deposition proceeds while a surface of the planarization film 17 being etched. When the deposition gas is in an off states as shown in FIG. 11, only the etching with the FIB 5 is performed. Since the etching with the FIB proceeds faster in the convex portion of the surface of the planarization film 17 than in the other portions, planarization of the surface of the planarization film 17 is accelerated as compared to the first embodiment by only performing the etching with the FIB 5. Accordingly, as illustrated in FIG. 13, the top surface of the planarization film 17 is more planarized as compared to the planarization film 7 of the first embodiment illustrated in FIG. 5. Furthermore, the planarization film 17 can have its top surface planarized by a smaller thickness than the planarization film 7 in the first embodiment shown in FIG. 5. As a result, etching back the planarization film 17 in the step illustrated in FIG. 14 utilizing the FIB 5 can be achieved in a reduced time period as compared to the step of etching back the planarization film 7 in the first embodiment illustrated in FIG. 6.

Although, the planarization films 7 and 17 of carbon films are formed utilizing a hydrocarbon based gas as the deposition gas 6 in the above-stated first and second embodiments, the invention is not limited thereto, and organic metal based gas including Mo, Cr, W, Si etc. or a metal carbonyl based gas may be utilized as the deposition gas 6. In that case, it is noted that the planarization films 7 and 17 formed by the deposition gas 6 should have an etching rate of about the same degree as the shifter bump defect 4.

Figure 18:
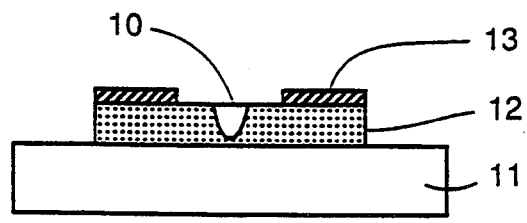
FIGS. 18 through 24 are cross sectional views for use in illustration of steps (1st-7th) in a method of correcting a shifter divot defect in a phase shift mask in accordance with a third embodiment of the invention.
Figure 19:
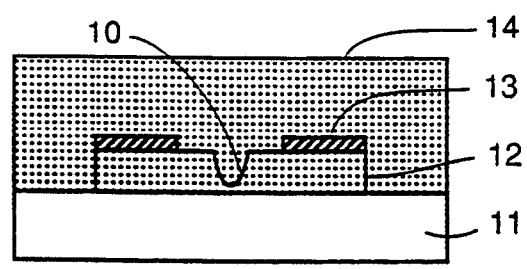

Referring to FIGS. 18 through 24, a third embodiment is a method of correcting a pattern defect in a phase shift mask having a shifter divot defect 10. More specifically, as illustrated in FIG. 18, in a usual phase shift mask, a phase shifter 12 of $SiO_2$ or the like is formed on a mask substrate 11 of silica. A metal light shielding film 13 of Cr, MoSi or the like is formed in a prescribed region on the phase shifter 12. The case in which a shifter divot defect 10 is present in the phase shifter 12 in the phase shift mask having such a structure is considered. In such a case, according to the third embodiment, as illustrated in FIG. 19, an SOG (Spin On Glass) film 14 is applied to cover the phase shifter 12 having the shifter divot defect 10. Thus, the shifter divot defect 10 is planarized. The SOG film 14 is not subjected to heat treatment so that the film has solution selectivity to the phase shifter 12 at the time of development. Herein, the phase "solution selectivity" means that the possibility of removing only the SOG film 14 while leaving the phase shifter 12 at the time of development.

Figure 20:
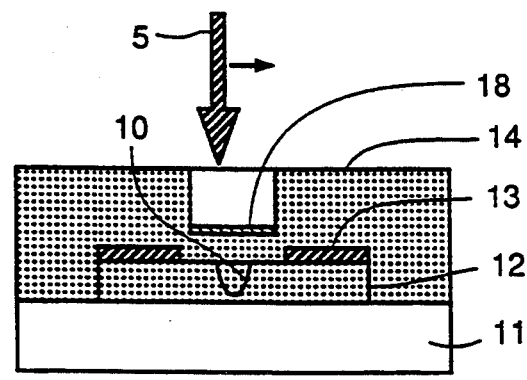
Figure 21:
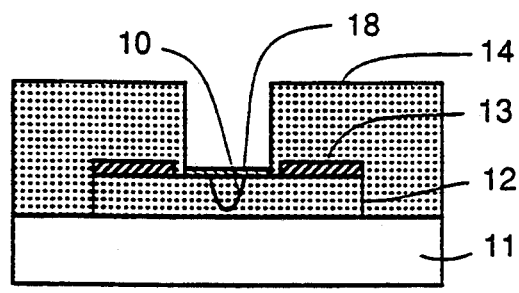

Now, as illustrated in FIG. 20, the SOG film 14 positioned in the upper part of the shifter divot defect 10 is etched back utilizing an FIB 5. As is the case with the first and second embodiments stated above, Ga ions may be employed as the FIB 5, or Au, or alternatively Au, Si, Be, In or Zn ions may be utilized. In the step of etching back, a layer containing ions 18 is created by ion irradiation upon the surface layer of a region to be etched back. For example, when Ga ions of 30 keV is utilized as the FIB 5, the layer containing ions 18 formed will have a thickness of about 30 nm. In this etching step, detection of a secondary signal such as secondary ions, secondary electrons, an x ray, etc. permits detection of signal change in the interface between the SOG film 14 and the phase shifter 12. The etching back is stopped based on a detection of such signal change. Thereby, the structure as shown in FIG. 21 is obtained. In this step of etching back, the region to be subjected to irradiation of FIB 5 may be more widely set and the etching back may be stopped before the interface with the phase shifter 12 by detecting the interface between the metal light shielding film 13 and the SOG film 14. This is to address the phenomenon that the SOG film 14 applied in the step illustrated in FIG. 19 slightly shrinks when a heat treatment is conducted in the final step.

Figure 22:
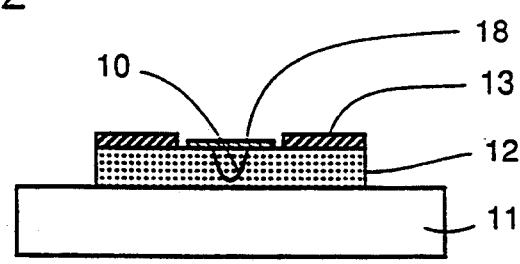

As illustrated in the FIG. 22, the SOG film 14 is removed away other than the region subjected to irradiation of the FIB (the layer containing ions 18) by development with alcohol.

Figure 23:
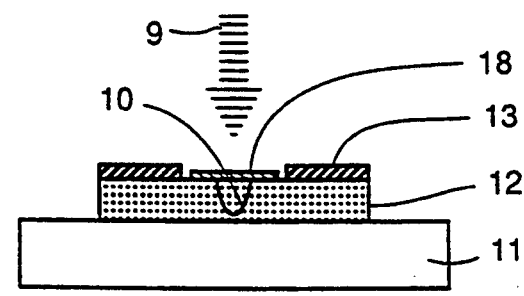
Figure 24:
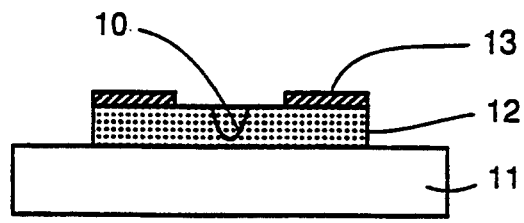
Figure 25:
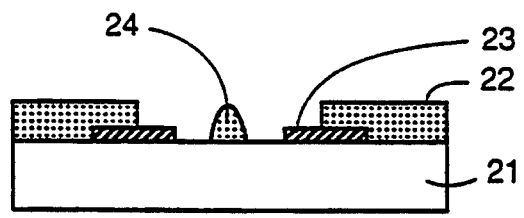
FIGS. 25 through 29 are cross sectional views for use in illustration of steps (1st-5th) in a method of correcting a shifter bump defect in a phase shift mask in accordance with a fourth embodiment of the invention.
Figure 26:
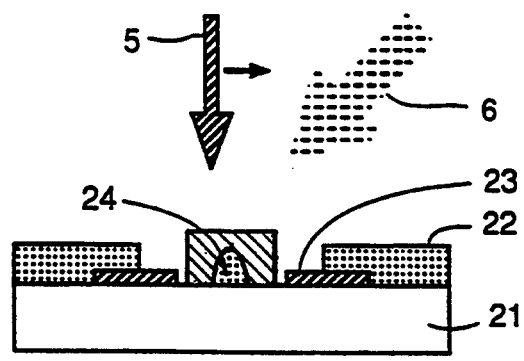
Figure 27:
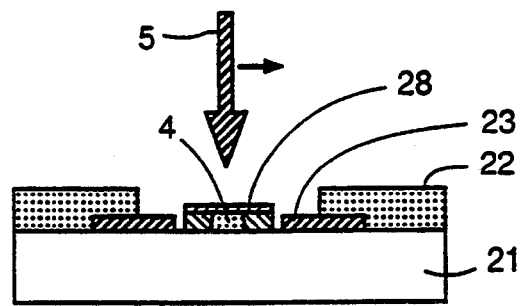
Figure 28:
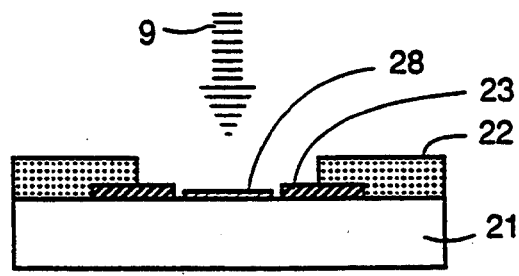
Figure 29:
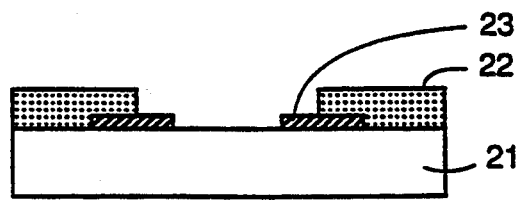
Figure 30:
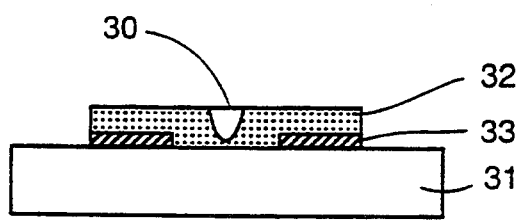
FIGS. 30 through 35 are cross sectional views for use in illustration of steps (1st-6th) in a method of correcting a shifter divot defect in a phase shift mask in accordance with a fifth embodiment of the invention.
Figure 31:
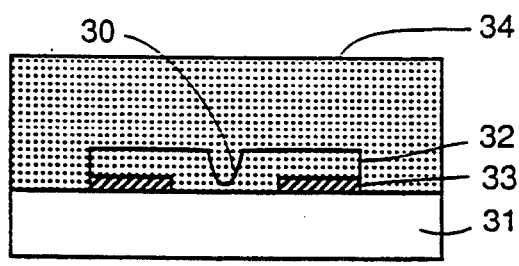
Figure 32:
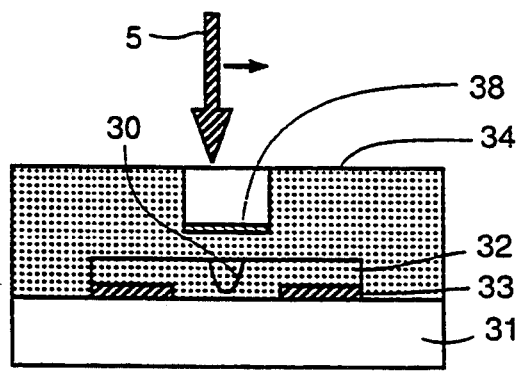
Figure 33:
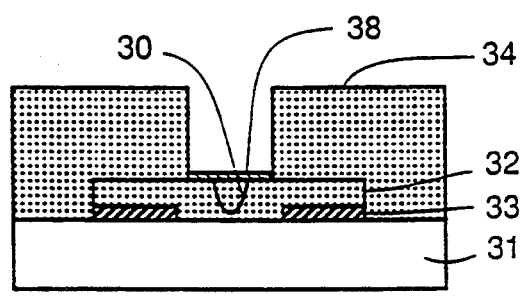
Figure 34:
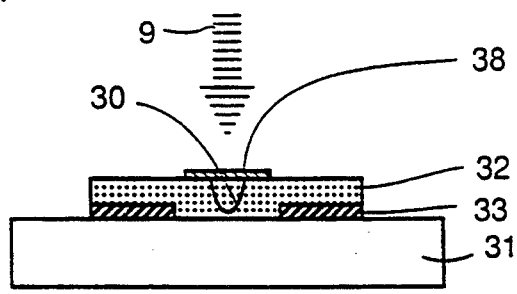
Figure 35:
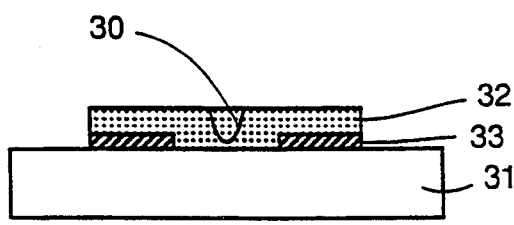
Figure 36:
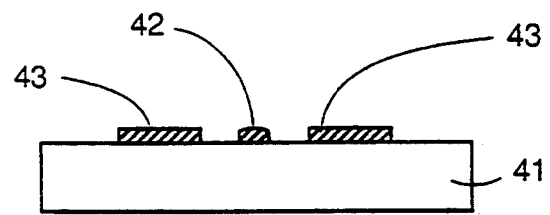
FIGS. 36 through 38 are cross sectional views for use in illustration of steps (1st-3rd) in a conventional method of correcting a black bump defect in the metal light shielding film of a general photomask.
Figure 37:
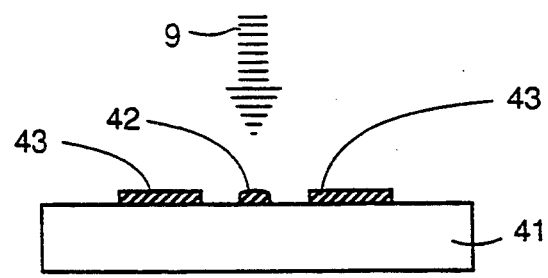
Figure 38:
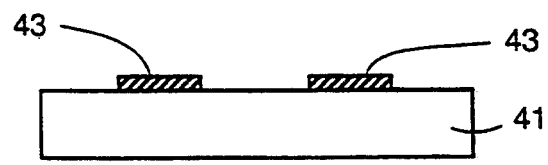
Figure 39:
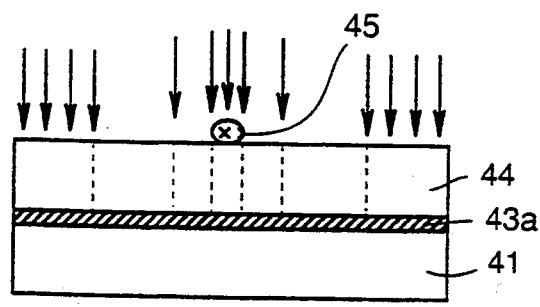
FIG. 39 is a cross sectional view showing a first step of a conventional general manufacturing process for illustrating a cause for generation of a metal light shielding film black defect in a photomask.
Figure 40:
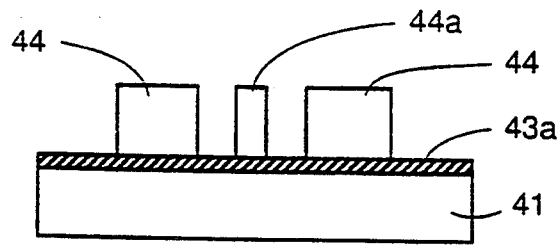
FIG. 40 is a cross sectional view showing a second step of the conventional manufacturing process for illustrating the cause for the metal light shielding film black defect in the photomask.
Figure 41:
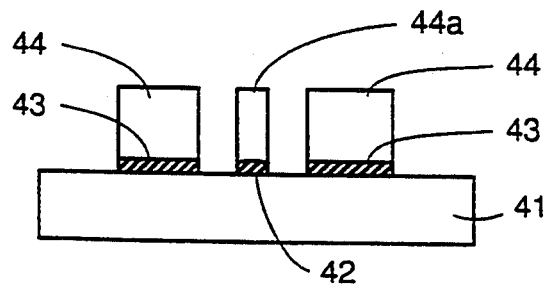
FIG. 41 is a cross sectional view showing a third step of the conventional manufacturing process for illustrating the cause for the metal light shielding film black defect in the photomask.
Figure 42:
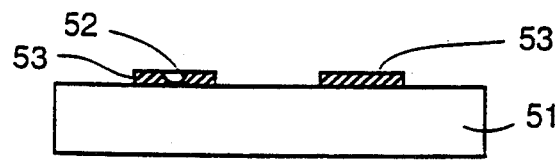
FIGS. 42 through 44 are cross sectional view for use in illustration of steps (1st-3rd) in a conventional method of correcting a white divot defect in the metal light shielding film of a general photomask.
Figure 43:
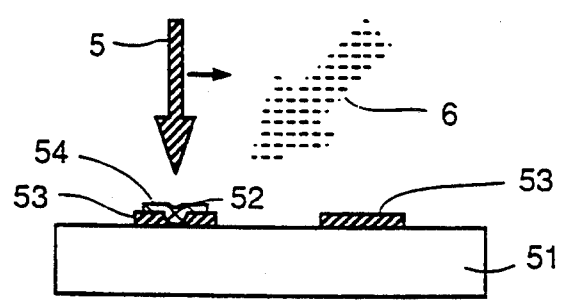
Figure 44:
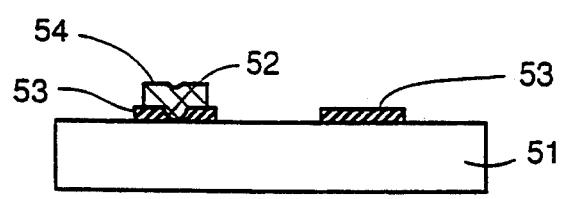
Figure 45:
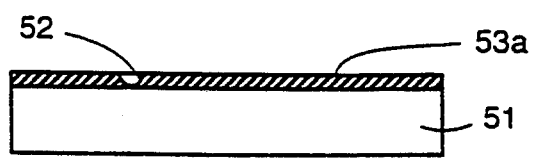
FIG. 45 is a cross sectional view for use in illustration of a cause for a metal light shielding film white defect in a conventional general photomask.
Figure 46A:
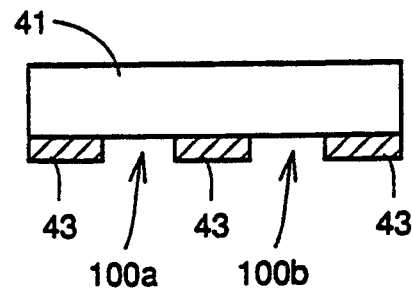
FIGS. 46(a)-(d) are is a first schematic view for use in illustration of the principles of a conventional phase shift process.
Figure 46B:
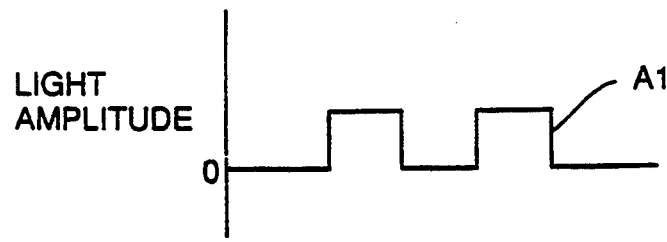
Figure 46C:
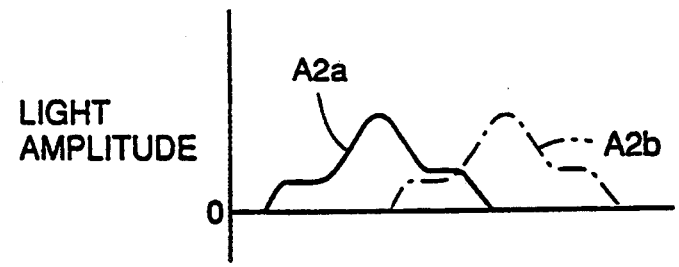
Figure 46D:
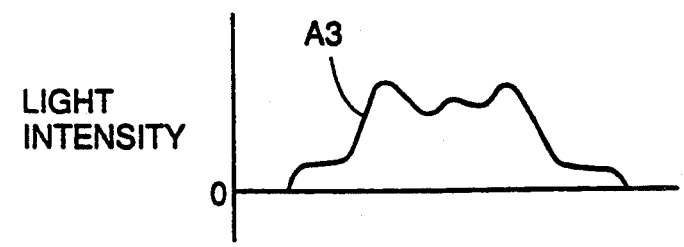
Figure 48:
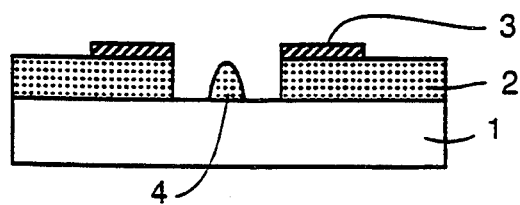
FIGS. 48 and 49 are cross sectional views for use in illustration of first and second steps in a conventional method of correcting a shifter bump defect in a phase shift mask.
Figure 49:
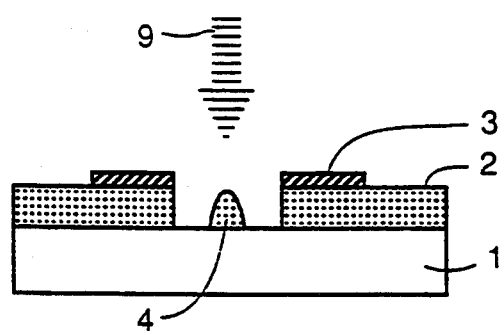
Figure 50:
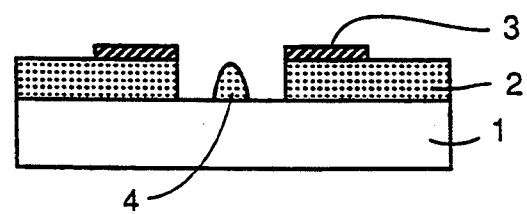
FIGS. 50-52 are cross sectional views for use in illustration of first, second and third steps in another conventional method of correcting a shifter bump defect in a phase shift mask.
Figure 51:
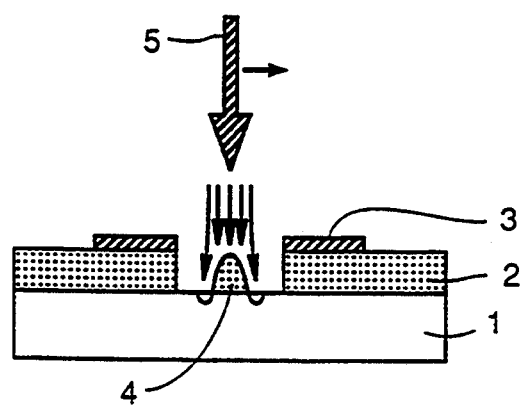
Figure 52:
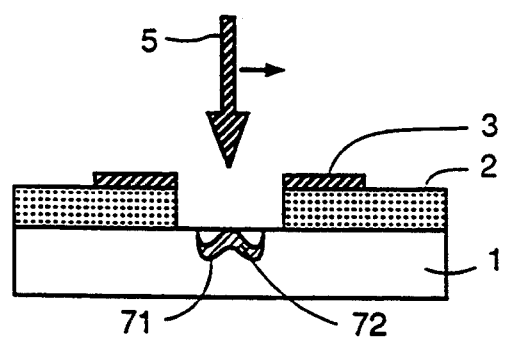
Figure 53:
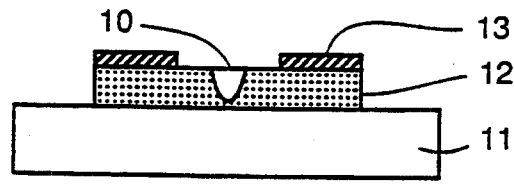
FIGS. 53 and 54 are cross sectional views for use in illustration of first and second steps in a conventional method of correcting a shifter divot defect in a phase shift mask.
Figure 54:
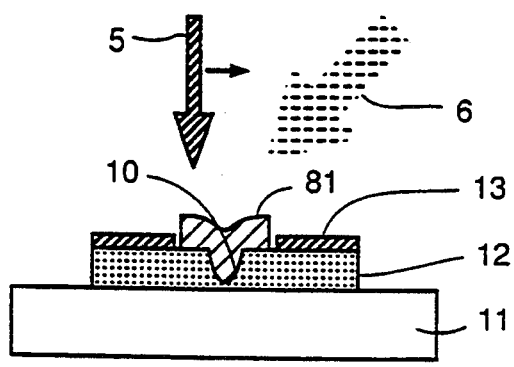
Figure 55:
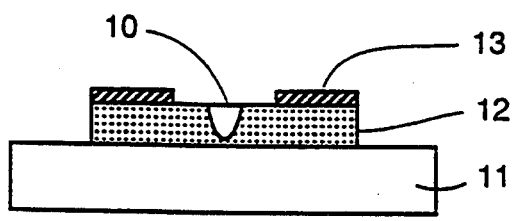
FIGS. 55 and 56 are cross sectional views for use in illustration of first and second steps in another conventional method of correcting a shifter divot defect in a phase shift mask.
Figure 56:
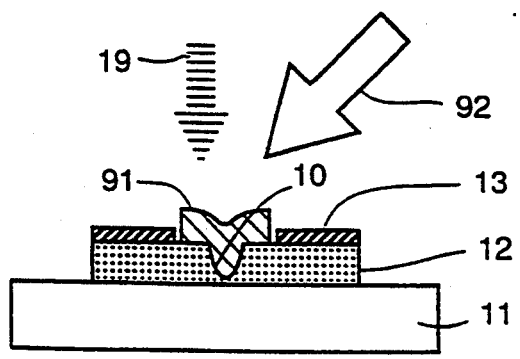

As illustrated in FIG. 23, the layer containing ions 18 is removed away by irradiating an Nd:YAG laser beam having a wavelength of 532 nm upon the layer containing ions 18. Thus, the shifter divot defect 10 is planarized as shown in FIG. 24.

Although in the third embodiment, the SOG film 14 is utilized as a material for covering the phase shifter 12, the invention is not limited thereto, any material having about the same refractive index as the phase shifter 12 and transmitting light may be utilized. For example, and negative resist containing CMS (Chloromethylstyrene) photosensitive to ions or image reversal resist may be utilized. Although in this embodiment, the SOG film 14 is utilized, the invention is not limited thereto, and any film having solution selectivity to the phase shifter 12 and the layer containing ions 18 at the time of development can be utilized.

Referring to FIGS. 25 to 29, a method of correcting a pattern defect in accordance with a fourth embodiment shows a method of correcting a shifter bump defect 24 in a phase shift mask with a metal light shielding film 23 positioned under a phase shifter 22. The method of correcting a pattern defect in accordance with the fourth embodiment is identical to the method of correcting a pattern defect in accordance with the second embodiment described in conjunction with FIGS. 9–17. A method of correcting a shifter bump defect in accordance with the invention may be applied to the case in which the phase shifter 22 is positioned above the metal light shielding film 23 as such.

Referring to FIGS. 30–35, in a method of correcting a pattern defect in accordance with a fifth embodiment, a method of correcting a shifter divot defect 30 when a metal light shielding film 33 is positioned under a phase shifter 32 is illustrated. The method of correcting the shifter divot defect 30 in accordance with the fifth embodiment itself is identical to the method of correcting in accordance with the third embodiment described in conjunction with FIGS. 18–24. Thus a method of correcting a shifter divot defect in accordance with the invention can be applied to the case in which the metal light shielding film 33 is positioned between the mask substrate 31 and the phase shifter 32.

According to a method of correcting a pattern defect in a phase shift mask according to the invention, a correction film surrounding and covering a bump defect is formed, then the correction film is etched back thereby removing the correction film together with the bump defect and therefore the bump can readily be removed away.

According to a method of correcting a pattern defect in a phase shift mask in accordance with the invention, a planarization film for covering a bump defect is formed by irradiating an ion beam upon a region including a bump defect in a phase shifter while supplying a deposition gas, the planarization film is etched back by irradiating an ion beam upon a surface of the planarization film, a layer containing ions is removed away by irradiating a laser beam to the layer containing ions remaining in the region etched back, and the bump defect is removed away together with the removal of the planarization film and the layer containing ions.

If the step of forming the planarization film stated above includes a first step of irradiating an ion beam upon a region including a bump defect while supplying a deposition gas thereto, and a second step of only irradiating an ion beam to the region including the bump defect, and the planarization film is formed by alternately conducting the first step and the second step at prescribed intervals, the surface of the planarization film formed will be more flattened, making it easier to remove the planarization film.

According to another method of correcting a pattern defect in a phase shift mask according to the invention, forming on a phase shifter having a divot defect, a correcting film having about the same refractive index as the phase shifter and solution selectivity to the phase shifter, the correction film is etched back to leave a part of the correction film in the divot defect, and the other parts of correction film are removed away, thereby readily correcting the divot defect.

According to another method of correcting a pattern defect in a phase shift mask in accordance with the invention, a first phase shifter layer having a divot defect in a phase shifter is covered by forming a second phase shifter layer with solution selectivity to the first phase shifter layer and a region subjected to irradiation of an ion beam so as to cover the first phase shifter layer, the divot defect will be filled. Irradiation of an ion beam upon a surface of the second phase shifter layer permit a prescribed portion of the second phase shifter layer to be etched back, the second phase shifter layer other than the region subjected to irradiation of the ion beam is removed away by developing the second phase shifter layer, a layer containing ions can be removed away by irradiating a laser beam upon the layer containing ions remaining in the region subjected to irradiation of the ion beam thus achieving the planarization, and the unnecessary second phase shifter layer and the layer containing ions can be removed away.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of correcting a pattern defect in a phase shift mask including a substrate, a phase shifter, and a light shielding film and having a bump defect, comprising the steps of:
    forming a correction film to surround and cover said bump defect; and
    removing away said bump defect together with said correction film by etching back said correction film, wherein said etching back is performed utilizing a focused ion beam.

2. A method of correcting a pattern defect in a phase shift mask as recited in claim 1, wherein
    said step of etching back includes the steps of,
    leaving ion residue and concave correction film residue by irradiating said ion beam except for the circumference of said correction film, and
    removing said ion residue and said correction film residue by irradiating said ion residue and said correction film residue with a laser beam.

3. A method of correcting a pattern defect in a phase shift mask as recited in claim 1, wherein
    said step of forming the correction film includes forming said correction film by supplying a deposition gas while irradiating the ion beam.

4. A method of correcting a pattern defect in a phase shift mask having a bump defect, comprising the steps of:
    forming a planarization film covering said bump defect by irradiating an ion beam upon a region containing said bump defect while supplying a deposition gas;
    etching back said planarization film by irradiating a focused ion beam upon a surface of said planarization film; and
    removing a layer containing ions remaining in the region after the planarization film is etched by irradiating a laser beam upon the layer containing ions.

5. A method of correcting a pattern defect in a phase shift mask as recited in claim 4, wherein
    said step of forming a planarization film includes
    a first step of irradiating an ion beam upon the region containing said bump defect while supplying said deposition gas thereto, and
    a second step of only irradiating an ion beam to the region containing said bump defect,
    said first step and said second step being conducted alternately at prescribed time intervals.

6. A method of correcting a pattern defect in a phase shift mask as recited in claim 4, wherein
    said step of forming a planarization film includes a step of forming the planarization film by irradiating an ion beam while continuously supplying a deposition gas.

7. A method of correcting a pattern defect in a phase shift mask as recited in claim 4, wherein
    said ion beam includes an ion beam utilizing one ion selected from the group consisting of Ga, Au, Si, Be, In, and Zn.

8. A method of correcting a pattern defect in a phase shift mask as recited in claim 4, wherein
    said deposition gas includes one deposition gas selected from the group constituting of a hydrocarbon based gas, an organic metal based gas, and a metal carbonyl based gas.

9. A method of correcting a pattern defect in a phase shift mask as recited in claim 4, wherein said laser beam includes an Nd:YAG laser.

10. A method of correcting a pattern defect in a phase shift mask as recited in claim 4, wherein
said planarization film is etched at a speed substantially identical to the speed of etching said bump defect.

11. A method of correcting a pattern defect in a phase shift mask as recited in claim 4, wherein
said step of etching back a planarization film includes stopping said etching back by detecting a secondary signal at the time of etching back said planarization film, thereby detecting a signal change in said secondary signal in the interface between a mask substrate and said planarization film.

12. A method of correcting a pattern defect in a phase shift mask including a substrate, a phase shifter having a divot defect, and a light shielding film, comprising the steps of:
forming on said phase shifter having said divot defect, a correction film having about the same refractive index as said phase shifter and solution selectivity to said phase shifter, and
etching back said correction film to leave part of said correction film in said divot defect, and removing the other part of correction film, wherein said etching back is performed utilizing a focused ion beam.

13. A method of correcting a pattern defect in a phase shift mask having a divot defect, comprising the steps of:
covering a first phase shifter layer having said divot defect by forming a second phase shifter layer having solution selectivity to said first phase shifter layer and the region subjected to irradiation of an ion beam;
etching back a prescribed part of said second phase shifter layer by irradiating a focused ion beam upon a surface of said second phase shifter layer;
removing said second phase shifter layer other than the region subjected to irradiation of said ion beam by developing said second phase shifter layer; and
removing a layer containing ions remaining in the region subjected to said ion beam by irradiating a laser beam upon said layer containing ions.

14. A method of correcting a pattern defect in a phase shift mask as recited in claim 13, wherein
said first phase shifter layer is an $SiO_2$ film, and
said second phase shifter layer is an SOG film.

15. A method of correcting a pattern defect in a phase shift mask as recited in claim 13, wherein
said ion beam includes an ion beam utilizing one kind of ion selected from the group constituting of Ga, Au, Si, Be, In, and Zn.

16. A method of correcting a pattern defect in a phase shift mask as recited in claim 13, wherein
said step of etching back a prescribed part of said second phase shifter layer includes a step of stopping said etching back by detecting a secondary signal at the time of etching back said second phase shifter layer, thereby detecting signal change in said secondary signal in the interface between said first phase shifter layer and said second phase shifter layer.

17. A method of correcting a pattern defect in a phase shift mask as recited in claim 13, wherein
said laser beam includes an Nd: YAG laser.

18. A method of correcting a pattern defect in a phase shift mask having a bump defect, comprising the steps of:
forming a planarization film covering said bump defect by irradiating an ion beam upon a region containing said bump defect while supplying a deposition gas;
etching back said planarization film by irradiating an ion beam upon a surface of said planarization film; and
removing a layer containing ions remaining in the region after the planarization film is etched by irradiating a laser beam upon the layer containing ions, wherein
said step of forming a planarization film includes
a first step of irradiating an ion beam upon the region containing said bump defect while supplying said deposition gas thereto, and
a second step of irradiating an ion beam only to the region containing said bump defect,
said first step and said second step being conducted alternately at prescribed time intervals.

19. A method of correcting a pattern defect in a phase shift mask having a bump defect, comprising the steps of:
forming a planarization film covering said bump defect by irradiating an ion beam upon a region containing said bump defect while supplying a deposition gas;
etching back said planarization film by irradiating an ion beam upon a surface of said planarization film; and
removing a layer containing ions remaining in the region after the planarization film is etched by irradiating a laser beam upon the layer containing ions, wherein
said step of etching back a planarization film includes stopping said etching back by detecting a secondary signal at the time of etching back said planarization film, thereby detecting a signal change in said secondary signal in the interface between a mask substrate and said planarization film.

20. A method of correcting a pattern defect in a phase shift mask having a divot defect, comprising the steps of:
covering a first phase shifter layer having said divot defect by forming a second phase shifter layer having solution selectivity to said first phase shifter layer and the region subjected to irradiation of an ion beam;
etching back a prescribed part of said second phase shifter layer by irradiating an ion beam upon a surface of said second phase shifter layer;
removing said second phase shifter layer other than the region subjected to irradiation of said ion beam by developing said second phase shifter layer; and
removing a layer containing ions remaining in the region subjected to said ion beam by irradiating a laser beam upon said layer containing ions, wherein
said step of etching back a prescribed part of said second phase shifter layer includes a step of stopping said etching back by detecting a secondary signal at the time of etching back said second phase shifter layer, thereby detecting signal change in said secondary signal in the interface between said first phase shifter layer and said second phase shifter layer.

* * * * *